(12) United States Patent
Kaneko et al.

(10) Patent No.: US 9,029,219 B2
(45) Date of Patent: May 12, 2015

(54) SEMICONDUCTOR WAFER MANUFACTURING METHOD, AND SEMICONDUCTOR WAFER

(75) Inventors: Tadaaki Kaneko, Sanda (JP); Noboru Ohtani, Sanda (JP); Shoji Ushio, Sanda (JP); Ayumu Adachi, Toyota (JP); Satoru Nogami, Osaka (JP)

(73) Assignees: Kwansei Gakuin Educational Foundation, Nishinomiya-shi (JP); Toyo Tanso Co., Ltd., Osaka-shi (JP)

( * ) Notice: Subject to any disclaimer, the term of this patent is extended or adjusted under 35 U.S.C. 154(b) by 0 days.

(21) Appl. No.: 14/240,710

(22) PCT Filed: Aug. 24, 2012

(86) PCT No.: PCT/JP2012/005301
§ 371 (c)(1),
(2), (4) Date: Jun. 13, 2014

(87) PCT Pub. No.: WO2013/031154
PCT Pub. Date: Mar. 7, 2013

(65) Prior Publication Data
US 2014/0319539 A1 Oct. 30, 2014

(30) Foreign Application Priority Data
Aug. 26, 2011 (JP) .................. 2011-185181

(51) Int. Cl.
*H01L 21/02* (2006.01)
*C30B 19/04* (2006.01)
(Continued)

(52) U.S. Cl.
CPC .......... *H01L 21/02664* (2013.01); *C30B 19/04* (2013.01); *C30B 29/36* (2013.01);
(Continued)

(58) Field of Classification Search
USPC .......................................................... 257/77
See application file for complete search history.

(56) References Cited

U.S. PATENT DOCUMENTS 5,679,153 A 10/1997 Dmitriev et al.
7,510,925 B2 * 3/2009 Miyanami .................... 438/197
(Continued)

FOREIGN PATENT DOCUMENTS

| JP | 10-509943 A | 9/1998 |
| JP | 2007-284298 A | 11/2007 |
| JP | 2008-230946 A | 10/2008 |
| JP | 2010-265126 A | 11/2010 |

(Continued)

OTHER PUBLICATIONS

International Search Report, dated Oct. 2, 2012, issued in corresponding application No. PCT/JP2012/005301.

*Primary Examiner* — Thao P Le
(74) *Attorney, Agent, or Firm* — Westerman, Hattori, Daniels & Adrian, LLP

(57) ABSTRACT

A method for manufacturing a semiconductor wafer includes a carbon layer formation step, a through hole formation step, a feed layer formation step, and an epitaxial layer formation step. In the carbon layer formation step, a carbon layer (71) is formed on a surface of a substrate (70) made of polycrystalline SiC. In the through hole formation step, through holes (71c) are formed in the carbon layer (71) formed on the substrate (70). In the feed layer formation step, a Si layer (72) and a 3C—SiC polycrystalline layer (73) are formed on a surface of the carbon layer (71). In the epitaxial layer formation step, the substrate (70) is heated so that a seed crystal made of 4H—SiC single crystal is formed on portions of the surface of the substrate (70) that are exposed through the through holes (71c), and a close-spaced liquid-phase epitaxial growth of the seed crystal is caused to form a 4H—SiC single crystal layer.

7 Claims, 13 Drawing Sheets

DURING EPITAXIAL LAYER FORMATION STEP
(GENERATION OF SEED CRYSTAL)

AFTER EPITAXIAL LAYER FORMATION STEP

(51) Int. Cl.
*C30B 29/36* (2006.01)
*H01L 21/67* (2006.01)
*C30B 19/12* (2006.01)
*H01L 29/16* (2006.01)

(52) U.S. Cl.
CPC .... *H01L21/02378* (2013.01); *H01L 21/02447* (2013.01); *H01L 21/02529* (2013.01); *H01L 21/0243* (2013.01); *H01L 21/02625* (2013.01); *H01L 21/02658* (2013.01); *H01L 21/67109* (2013.01); *C30B 19/12* (2013.01); *H01L 29/1608* (2013.01)

(56) References Cited

U.S. PATENT DOCUMENTS

| | | | | |
|---|---|---|---|---|
| 7,598,142 | B2* | 10/2009 | Ranade et al. | 438/269 |
| 2005/0277260 | A1* | 12/2005 | Cohen et al. | 438/387 |
| 2007/0228505 | A1* | 10/2007 | Mazzola et al. | 257/471 |

FOREIGN PATENT DOCUMENTS

| | | |
|---|---|---|
| JP | 2011-119412 A | 6/2011 |
| WO | 96-17112 A1 | 6/1996 |

* cited by examiner (a)

(b)

(a) POLYCRYSTALLINE SiC SUBSTRATE BEFORE PROCESS STEPS ARE STARTED (b) AFTER CARBON LAYER FORMATION STEP (c) AFTER THROUGH HOLE FORMATION STEP (d) AFTER FEEDER LAYER FORMATION STEP (e) DURING EPITAXIAL LAYER FORMATION STEP
(GENERATION OF SEED CRYSTAL)

(f) AFTER EPITAXIAL LAYER FORMATION STEP (g) SEMICONDUCTOR WAFER OBTAINED IN FIRST EMBODIMENT (a) POLYCRYSTALLINE SiC SUBSTRATE BEFORE PROCESS STEPS ARE STARTED (b) AFTER CARBON LAYER FORMATION STEP (c) AFTER THROUGH HOLE FORMATION STEP (d) AFTER FEEDER LAYER FORMATION STEP (e) DURING EPITAXIAL LAYER FORMATION STEP (GENERATION OF SEED CRYSTAL)

(f) AFTER EPITAXIAL LAYER FORMATION STEP (g) SEMICONDUCTOR WAFER OBTAINED IN SECOND EMBODIMENT (a) CHANGE IN RATE OF GROWTH ON Si SURFACE OF 4H-SiC SINGLE CRYSTAL WITH RESPECT TO a-AXIS (HORIZONTAL) DIRECTION (b) CHANGE IN RATE OF GROWTH ON Si SURFACE OF 4H-SiC SINGLE CRYSTAL WITH RESPECT TO c-AXIS (VERTICAL) DIRECTION (c) CHANGE IN RATIO OF RATE OF GROWTH IN a-AXIS DIRECTION / RATE OF GROWTH IN c-AXIS DIRECTION ON Si SURFACE OF 4H-SiC SINGLE CRYSTAL

SEMICONDUCTOR WAFER MANUFACTURING METHOD, AND SEMICONDUCTOR WAFER

TECHNICAL FIELD

The present invention relates to a method for manufacturing a semiconductor wafer by using a substrate that is made of, at least in a surface thereof, SiC.

BACKGROUND ART

Silicon (Si), gallium arsenide (GaAs), and the like, are conventionally known as a semiconductor material for high-frequency devices. Recently, the field of use of high-frequency devices is rapidly expanding. The high-frequency devices are accordingly more often used under severe environments such as a high temperature environment. Therefore, achievement of a high-frequency device that is able to withstand a high temperature environment is one of important problems from the viewpoint of a reliable operation, processing of a large amount of information, and improvement in the controllability in wide ranges of applications and environments.

Silicon carbide (SiC) is of interest as one of materials that can be used for manufacturing a semiconductor wafer having an excellent heat resistance. SiC has an excellent mechanical strength and a radiation hardness. Moreover, adding impurities to SiC enables a valence electron such as an electron or a hole to be easily controlled, and SiC is characterized in a wide band gap (about 3.0 eV in 6H monocrystalline SiC; 3.2 eV in 4H monocrystalline SiC), a high breakdown field (2.8 MV/cm in 4H monocrystalline SiC, which is about ten times that of Si and GaAs), and a high saturated drift velocity of electrons ($2.2 \times 10^7$ cm/s in 4H monocrystalline SiC, which is about twice that of Si). This is why SiC is expected as a material for a next-generation power device that achieves a high-temperature resistance, high frequency resistance, high voltage resistance, and high environment resistance, which cannot be achieved by the existing semiconductor material described above.

A method for manufacturing a semiconductor wafer using SiC, including forming an epitaxial layer, has been conventionally known. This type of manufacturing method is disclosed in, for example, Patent Documents 1 to 3.

In the Patent Document 1, a SiC epitaxial layer is formed through a CVD (Chemical Vapor Deposition) process. In the step of causing an epitaxial growth, a defect suppression layer, which is formed at a reduced growth rate of 1 μm or less per hour, is introduced, thus enabling formation of a SiC epitaxial layer containing a smaller amount of defects.

The Patent Document 2 discloses the following method for forming a SiC epitaxial layer. The method for forming a SiC epitaxial layer includes the steps of: causing a SiC bulk crystal to grow by using the technique of seed crystal addition and sublimation; and causing a liquid-phase epitaxial growth on a surface of the bulk crystal. In the step of causing the liquid-phase epitaxial growth, a melting growth is caused so that a micropipe defect having propagated from the seed crystal to the substrate of the bulk crystal is closed, which achieves formation of a SiC epitaxial layer containing a smaller amount of micropipe defects.

In the Patent Document 3, a metastable solvent epitaxy (MSE) process is disclosed as a method for causing a close-spaced liquid-phase epitaxial growth of monocrystalline SiC. The MSE process is a method in which: a seed substrate made of monocrystalline SiC and a carbon feed substrate having a higher free energy than that of the seed substrate are arranged opposed to each other, and a Si melt layer serving as a solvent (carbon transfer medium) is interposed between the seed substrate and the carbon feed substrate; and then, the seed substrate and the carbon feed substrate are subjected to a heat treatment in a high-temperature vacuum environment, thus causing an epitaxial growth of monocrystalline SiC on a surface of the seed substrate.

PRIOR-ART DOCUMENTS

Patent Documents

Patent Document 1: Japanese Patent Application Laid-Open No. 2007-284298
Patent Document 2: Japanese Unexamined Patent Application Publication (Translation of PCT Application) No. 10-509943 (1998)
Patent Document 3: Japanese Patent Application Laid-Open No. 2008-230946

SUMMARY OF THE INVENTION

Problems to be Solved by the Invention

The methods disclosed in the Patent Documents 1 to 3 require a seed substrate made of monocrystalline SiC in order to form an epitaxial layer made of monocrystalline SiC. Since a substrate made of monocrystalline SiC is very expensive, the methods disclosed in the Patent Documents 1 to 3 result in an increased cost for manufacturing a semiconductor device.

Additionally, an substrate made of monocrystalline SiC has a limitation in terms of available diameters. Therefore, the methods disclosed in the Patent Documents 1 to 3 face difficulties in manufacturing a semiconductor wafer having a large diameter.

The present invention has been made in view of the circumstances described above, and an object of the present invention is to provide a method for manufacturing a semiconductor wafer, the method including forming a monocrystalline SiC epitaxial layer on a surface of a substrate, the method enabling a reduction in the manufacturing cost and an increase in the diameter of the semiconductor wafer.

Means for Solving the Problems and Effects Thereof

Problems to be solved by the present invention are as described above, and next, means for solving the problems and effects thereof will be described.

In a first aspect of the present invention, the following method for manufacturing a semiconductor wafer is provided. The method for manufacturing a semiconductor wafer includes a carbon layer formation step, a through hole formation step, a feed layer formation step, and an epitaxial layer formation step. In the carbon layer formation step, a carbon layer is formed on a surface of a substrate that is, at least in its surface, made of polycrystalline SiC. In the through hole formation step, a through hole is formed in the carbon layer by, for example, emission of a laser beam to the carbon layer formed on the substrate. In the feed layer formation step, a Si layer is formed on a surface of the carbon layer formed on the substrate, and a feed layer made of polycrystalline SiC is formed on a surface of the Si layer. In the epitaxial layer formation step, a heat treatment is performed on the substrate in a temperature range of 1600° C. or more and 2300° C. or less to cause a seed crystal made of 4H—SiC single crystal to be formed on a portion of the surface of the substrate that is exposed through the through hole, and the heat treatment is continued to cause a close-spaced liquid-phase epitaxial growth of the seed crystal, so that an epitaxial layer made of 4H—SiC single crystal is formed.

A semiconductor wafer can be manufactured by using a substrate that is, at least in its surface, made of polycrystalline SiC. Since a substrate made of polycrystalline SiC is less expensive than a substrate made of monocrystalline SiC, the manufacturing cost of a semiconductor wafer can be reduced. Additionally, since a substrate made of polycrystalline SiC having a large diameter is more available than a substrate made of monocrystalline SiC having a large diameter, a semiconductor wafer having a large diameter can be manufactured.

In the method for manufacturing the semiconductor wafer, the following is preferable. A plurality of groove portions or wall portions are formed on the surface of the substrate. In the through hole formation step, the through hole is formed in each of regions enclosed by the groove portions or the wall portions. In the epitaxial layer formation step, the epitaxial layer made of 4H—SiC single crystal is formed in each of the regions.

Accordingly, interference such as hindrance to the growth due to contact between adjacent epitaxial layers and generation of crystal dislocation in a portion where the contact occurs can be prevented by the groove portions or the wall portions. Therefore, a semiconductor wafer having the epitaxial layers corresponding to a plurality of chips can be manufactured with a high quality and in a shorter growth time than the growth time required for a single seed crystal to grow to the entire area of the wafer.

In the method for manufacturing a semiconductor wafer, it is preferable that, in the carbon layer formation step, heating is performed in a temperature range of 1500° C. or more and 2300° C. or less under a vacuum of $10^{-2}$ Torr or less and preferably $10^{-5}$ Torr or less, to cause Si atoms in the surface of the substrate to sublimate, so that the carbon layer is formed.

Thereby, a thin film made of a carbon nano-material can be successfully generated on the surface of the substrate. This enables only the portion exposed through the through hole to react appropriately. Additionally, this can prevent entry of impurities into a gap between the substrate and the carbon layer.

In the method for manufacturing a semiconductor wafer, it may be acceptable that, in the carbon layer formation step, the carbon layer is formed through a chemical vapor deposition process, an organic resist process, or electron cyclotron resonance sputtering.

This enables the carbon layer to be efficiently formed on the surface of the substrate.

In the method for manufacturing a semiconductor wafer, it is preferable that, in the through hole formation step, an infrared laser beam is used to form the through hole, the laser beam having a spot diameter of 100 μm or less and preferably 50 μm or less.

As a result, the area of the portion exposed through the through hole can be reduced, and a single seed crystal can be generated in the through hole. Generation of a plurality of seed crystals in the through hole, occurrence of hindrance to the growth due to contact between the seed crystals, and generation of crystal dislocation in a portion where the contact occurs, can be suppressed.

In the method for manufacturing a semiconductor wafer, in the epitaxial layer formation step, the temperature for the heat treatment is controlled to cause the epitaxial layer made of 4H—SiC single crystal to grow in such a manner that the rate of epitaxial growth in a horizontal direction (a-axis direction) of the epitaxial layer is five to ten times higher than the rate of epitaxial growth in a thickness direction (c-axis direction) of the epitaxial layer.

Accordingly, semiconductor wafers can be manufactured in which the aspect ratio of the epitaxial layer has been adjusted in accordance with various demands. Since no special member is required for adjusting the aspect ratio, a manufacturing apparatus can be simplified.

In a second aspect of the present invention, a semiconductor wafer having the following configuration is provided. The semiconductor wafer is manufactured by the method for manufacturing a semiconductor wafer, in which the temperature for the heat treatment for causing a close-spaced liquid-phase epitaxial growth of the seed crystal is controlled to control the aspect ratio of the epitaxial layer made of 4H—SiC single crystal in such a manner that the size in a horizontal direction (a-axis direction) of the epitaxial layer is five to ten times the size in a thickness direction (c-axis direction) of the epitaxial layer.

Accordingly, semiconductor wafers can be manufactured in which the aspect ratio of the epitaxial layer has been adjusted in accordance with various demands. Since no special member is required for adjusting the aspect ratio, a manufacturing apparatus can be simplified.

EMBODIMENT FOR CARRYING OUT THE INVENTION

Figure 1:
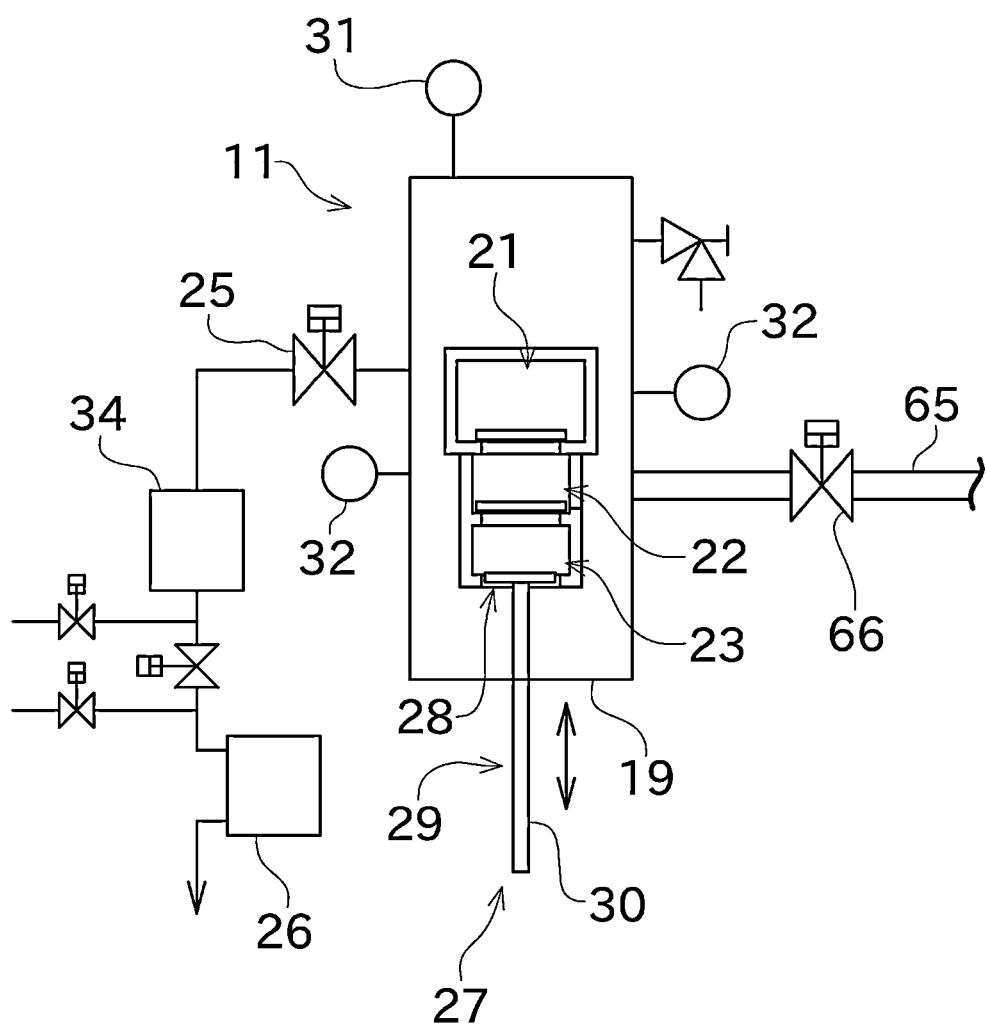
FIG. 1 A diagram schematically showing a high-temperature vacuum furnace that is used in a heat treatment for manufacturing a semiconductor wafer.
Figure 2:
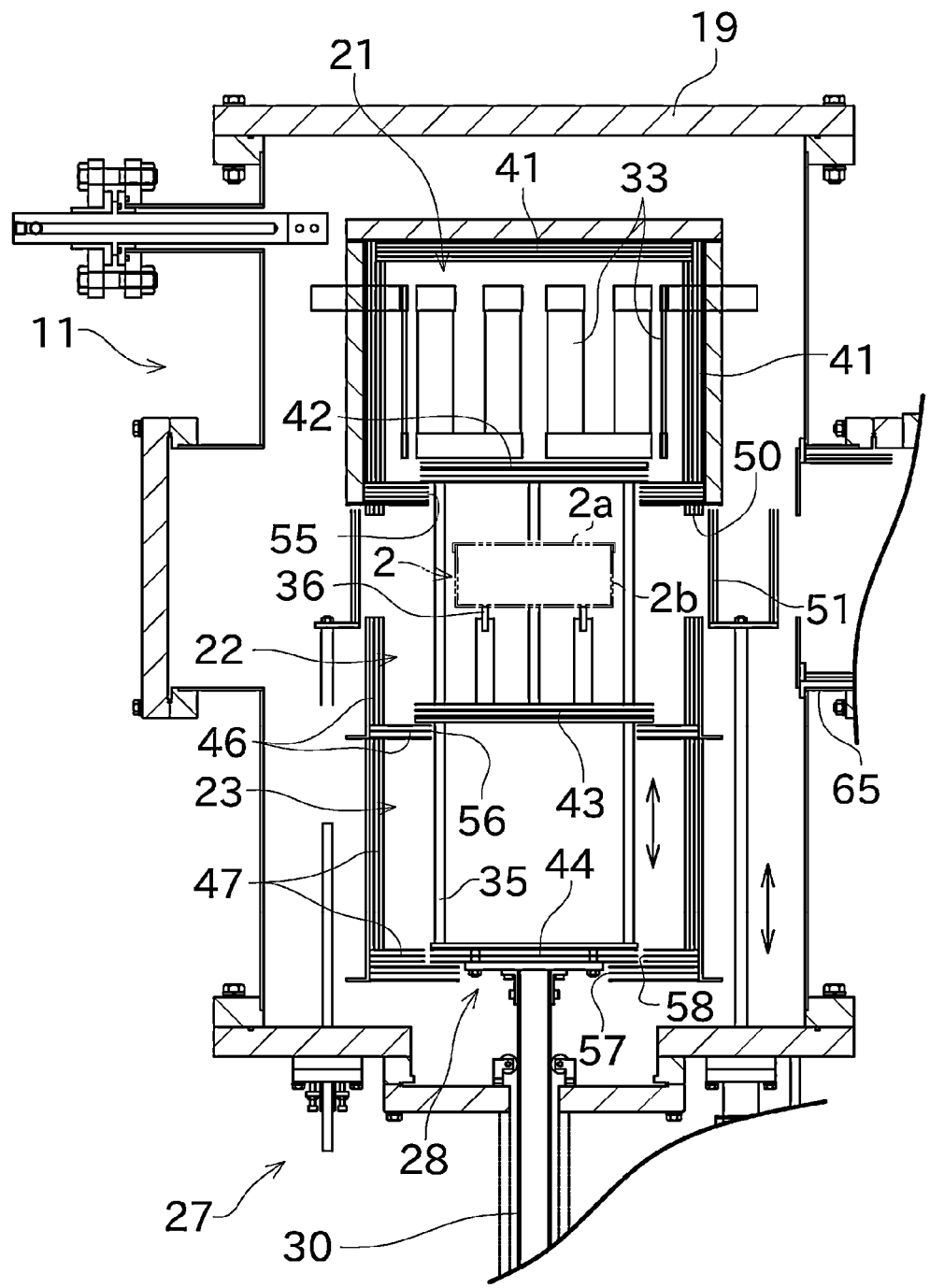
FIG. 2 A cross-sectional view showing details of a main heating chamber and a preheating chamber of a high-temperature vacuum furnace.
Figure 3:
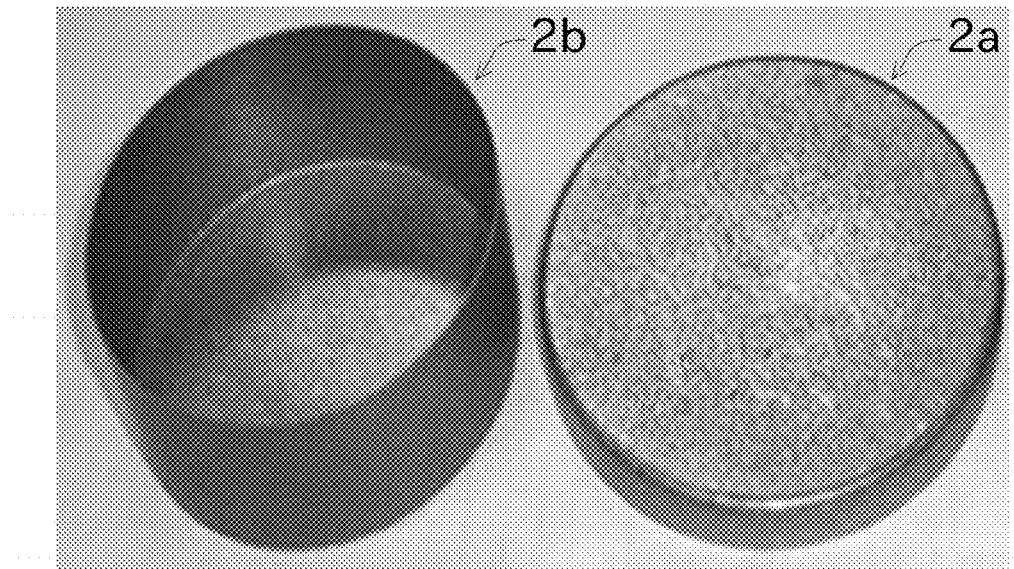
FIG. 3 Photographs showing an external appearance and a cross-section of a crucible.
Figure 3:
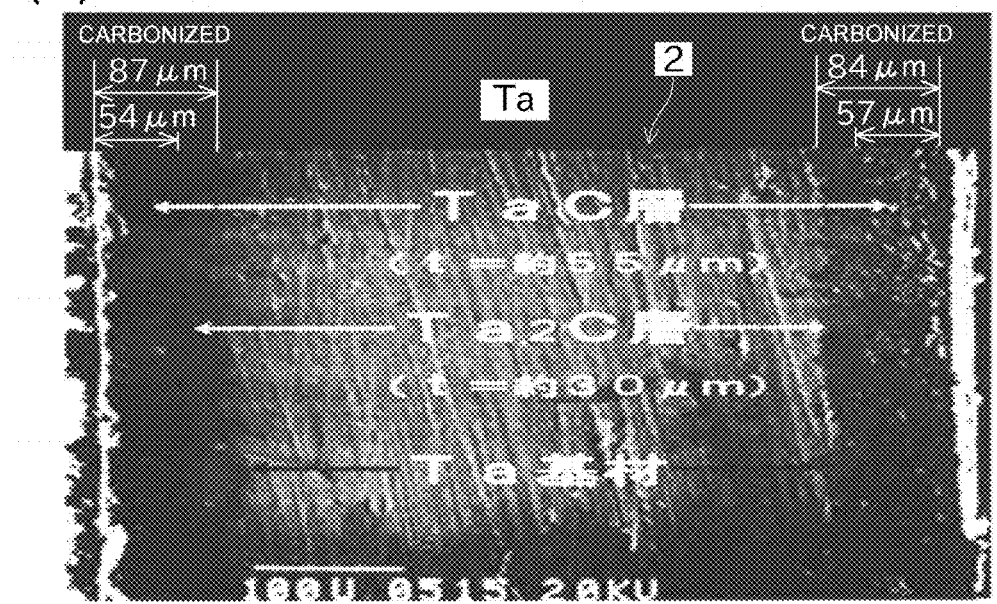

Next, an embodiment of the invention will be described. Firstly, a high-temperature vacuum furnace 11 and a crucible (fitted container) 2 that are used for manufacturing a semiconductor wafer will be described. FIG. 1 is a diagram schematically showing the high-temperature vacuum furnace 11 that is used in a heat treatment for manufacturing a semiconductor wafer. FIG. 2 is a cross-sectional view showing details of a main heating chamber 21 and a preheating chamber 22 of the high-temperature vacuum furnace 11. FIG. 3(a) is a photograph showing an external appearance of the crucible 2 as photographed from the upper side thereof. FIG. 3(b) is a photomicrograph of a cross-section of the crucible 2.

As shown in FIGS. 1 and 2, the high-temperature vacuum furnace 11 includes a main heating chamber 21 and a preheating chamber 22. The main heating chamber 21 enables a processing object to be heated to a temperature of 1000° C. or more and 2300° C. or less. The preheating chamber 22 enables a processing object to be preheated to a temperature of 500° C. or more. The preheating chamber 22 is arranged below the main heating chamber 21, and adjacent to the main heating chamber 21 with respect to the vertical direction. The high-temperature vacuum furnace 11 includes a heat insulating chamber 23 arranged below the preheating chamber 22. The heat insulating chamber 23 is adjacent to the preheating chamber 22 with respect to the vertical direction.

The high-temperature vacuum furnace 11 includes a vacuum chamber 19. The main heating chamber 21 and the preheating chamber 22 are arranged inside the vacuum chamber 19. A turbo-molecular pump 34 serving as a vacuum-producing apparatus is connected to the vacuum chamber 19, so that a vacuum of, for example, $10^{-2}$ Pa or less, and desirably $10^{-7}$ Pa or less, can be produced inside the vacuum chamber 19. A gate valve 25 is interposed between the turbo-molecular pump 34 and the vacuum chamber 19. A rotary pump 26 for auxiliary use is connected to the turbo-molecular pump 34.

The high-temperature vacuum furnace 11 includes a moving mechanism 27 that is configured to vertically move a processing object at a location between the preheating chamber 22 and the main heating chamber 21. The moving mechanism 27 includes a support member 28 and a cylinder part 29. The support member 28 is configured to support a processing object. The cylinder part 29 is configured to move the support member 28 in the vertical direction. The cylinder part 29 includes a cylinder rod 30. One end of the cylinder rod 30 is coupled to the support member 28. A vacuum meter 31 for measuring the degree of vacuum and a mass spectrometry apparatus 32 for performing mass spectrometry are provided in the high-temperature vacuum furnace 11.

The vacuum chamber 19 is connected via a transport path 65 to a stock storage (not shown) for storing processing objects. The transport path 65 can be opened and closed by a gate valve 66.

The main heating chamber 21, whose cross-section has a regular hexagonal shape in a plan view, is arranged in an upper portion of an internal space of the vacuum chamber 19. As shown in FIG. 2, a mesh heater 33 serving as a heating apparatus is provided in the main heating chamber 21. A first multi-layer heat reflection metal plate 41 is fixed to a sidewall and a ceiling of the main heating chamber 21. The first multi-layer heat reflection metal plate 41 is configured to reflect heat of the mesh heater 33 toward a central area of the main heating chamber 21.

As a result, a layout in which the mesh heater 33 surrounds a processing object which is an object of a heat treatment and the multi-layer heat reflection metal plate 41 is arranged further outside the mesh heater 33 is achieved within the main heating chamber 21. This enables the processing object to be strongly and uniformly heated, and its temperature to be raised up to 1000° C. or more and 2300° C. or less.

The ceiling side of the main heating chamber 21 is closed by the first multi-layer heat reflection metal plate 41. The first multi-layer heat reflection metal plate 41 arranged on a bottom surface of the main heating chamber 21 has a through hole 55. The processing object is movable through the through hole 55 between the main heating chamber 21 and the preheating chamber 22 arranged below and adjacent to the main heating chamber 21.

A portion of the support member 28 of the moving mechanism 27 is received in the through hole 55. The support member 28 includes a second multi-layer heat reflection metal plate 42, a third multi-layer heat reflection metal plate 43, and a fourth multi-layer heat reflection metal plate 44, which are arranged in this order from the upper side and which are spaced apart from one another.

The three multi-layer heat reflection metal plates 42 to 44, all of which are provided horizontally, are coupled to one another by column portions 35 that is provided vertically. A tray 36 is arranged in a space formed between the second multi-layer heat reflection metal plate 42 and the third multi-layer heat reflection metal plate 43. The processing object can be placed on the tray 36. In this embodiment, the tray 36 is made of tantalum carbide.

A flange is formed in an end portion of the cylinder rod 30 of the cylinder part 29. The flange is fixed to a lower surface of the fourth multi-layer heat reflection metal plate 44. In this configuration, extension and contraction of the cylinder part 29 enable the processing object placed on the tray 36 to vertically move together with the three multi-layer heat reflection metal plates 42 to 44.

The preheating chamber 22 is formed by a multi-layer heat reflection metal plate 46 enclosing a space existing below the main heating chamber 21. The preheating chamber 22 has a circular cross-section in a plan view. Heating means such as the mesh heater 33 is not provided in the preheating chamber 22.

As shown in FIG. 2, the multi-layer heat reflection metal plate 46 arranged on a bottom surface of the preheating chamber 22 has a through hole 56. The multi-layer heat reflection metal plate 46 that defines a sidewall of the preheating chamber 22 has a passage hole 50. The passage hole 50 is formed at a location opposed to the transport path 65. The high-temperature vacuum furnace 11 further includes an open/close member 51 that is configured to close the passage hole 50.

The heat insulating chamber 23 arranged below and adjacent to the preheating chamber 22 has its upper portion defined by the multi-layer heat reflection metal plate 46 and its lower and side portions defined by a multi-layer heat reflection metal plate 47. The multi-layer heat reflection metal plate 47 that covers the lower side of the heat insulating chamber 23 has a through hole 57, through which the cylinder rod 30 can be received.

The multi-layer heat reflection metal plate 47 has a storage recess 58. The storage recess 58 is formed at a position corresponding to an upper end portion of the through hole 57. The storage recess 58 is configured to store the fourth multi-layer heat reflection metal plate 44 of the support member 28.

Any of the multi-layer heat reflection metal plates 41 to 44, 46, 47 is structured such that metal plates (made of tungsten) are stacked with predetermined intervals therebetween. A multi-layer heat reflection metal plate having the same configuration is also adopted as a portion of the open/close member 51 that closes the passage hole 50.

Any material is adoptable for the multi-layer heat reflection metal plates 41 to 44, 46, 47, as long as the material has sufficient heating characteristics relative to thermal radiation of the mesh heater 33 and the melting point of the material is higher than the ambient temperature. For example, not only the tungsten, but also a metal material having a high melting point, such as tantalum, niobium, and molybdenum, is adoptable for the multi-layer heat reflection metal plates 41 to 44, 46, 47. Alternatively, a carbide such as tungsten carbide, zirconium carbide, tantalum carbide, hafnium carbide, and molybdenum carbide is adoptable for the multi-layer heat reflection metal plates 41 to 44, 46, 47. It may be also acceptable that an infrared reflective coating made of gold, tungsten carbide, or the like, is further formed on reflecting surfaces of the multi-layer heat reflection metal plates 41 to 44, 46, 47.

Each of the multi-layer heat reflection metal plates 42 to 44 provided in the support member 28 includes tungsten plates each having a perforated metal structure in which many small through holes are formed. The tungsten plates are stacked with predetermined interval therebetween and with the positions of the through holes being misaligned from one another.

The number of the second multi-layer heat reflection metal plates 42 stacked in the uppermost layer of the support member 28 is less than the number of the first multi-layer heat reflection metal plates 41 stacked in the main heating chamber 21.

In this configuration, the processing object (for example, a SiC substrate) is stored in an appropriate container for the prevention of contamination of the inside of the vacuum chamber 19. The container may be the crucible 2 which will be described later, or may be another container. In this state, the processing object is introduced through the transport path 65 into the vacuum chamber 19, and placed on the tray 36 provided within the preheating chamber 22. Driving the mesh heater 33 under this condition causes the main heating chamber 21 to be heated up to a predetermined temperature of 1,000° C. or more and 2300° C. or less (for example, about 1800° C.). At this time, the turbo-molecular pump 34 is driven, so that the pressure inside the vacuum chamber 19 is adjusted to $10^{-3}$ or less, and preferably $10^{-5}$ or less.

As mentioned above, the number of the stacked second multi-layer heat reflection metal plates 42 of the support member 28 is less than the number of the stacked first multi-layer heat reflection metal plate 41. As a result, part of the heat generated by the mesh heater 33 is moderately supplied (distributed) to the preheating chamber 22 via the second multi-layer heat reflection metal plate 42, and thus the SiC substrate placed in the preheating chamber 22 can be preheated to a predetermined temperature of 500° C. or more (for example, 800° C.). That is, preheating can be achieved even though no heater is placed in the preheating chamber 22, and a simple structure of the preheating chamber 22 can be achieved.

After the above-described preheat treatment is performed for a predetermined time period, the cylinder part 29 is driven to move up the support member 28. As a result, the SiC substrate moves from the lower side through the through hole 55 into the main heating chamber 21. Thereby, the main heat treatment is immediately started, and the temperature of the SiC substrate placed within the main heating chamber 21 can be rapidly raised to a predetermined temperature (about 1800° C.).

Next, the crucible (reception container) 2 will be described. As shown in FIG. 3(a), the crucible 2 includes an upper container 2a and a lower container 2b that are fittable to each other. The crucible 2 is made of tantalum metal, and configured such that a tantalum-carbide layer is exposed to an internal space of the crucible 2.

Further detailed description will be given. As shown in FIG. 3(b), the crucible 2 is configured such that a TaC layer is formed in the most superficial layer, a $Ta_2C$ layer is formed inside the TaC layer, and a tantalum metal serving as a base material is arranged inside the $Ta_2C$ layer. Since the state in which tantalum and carbon are bound exhibits temperature dependency, the crucible 2 is configured such that TaC which has a high carbon concentration is arranged in the most superficial layer while $Ta_2C$ which has a slightly lower carbon concentration is arranged inside, and a tantalum metal serving as the base material whose carbon concentration is zero is arranged further inside.

In performing a heat treatment on the crucible 2, the crucible 2 is arranged in the preheating chamber 22 of the high-temperature vacuum furnace 11 as indicated by the dot-dash-line in FIG. 2, and preheated at an appropriate temperature (for example, about 800° C.). Then, the cylinder part 29 is driven to move the crucible 2 placed in the preheating chamber 22 into the main heating chamber 21 whose temperature has been raised to a preset temperature (for example, about 1800° C.), so that the temperature is rapidly raised.

It is preferable that, in the heating in the main heating chamber 21, the atmosphere within the crucible 2 is kept at a vacuum of about 1 Pa or less. The vacuum within the crucible 2 is achieved in a state where the upper container 2a is removed or achieved by a gap formed in a portion where the upper container 2a and the lower container 2b are fitted to each other.

In this embodiment, the high-temperature vacuum furnace 11 and the crucible 2 having the above-described configuration are used to manufacture a semiconductor wafer from a substrate. In the following description, when a CVD process, a heat treatment, and the like, is simply mentioned, it should be understood that they are performed by using the high-temperature vacuum furnace 11 described above.

Figure 4:
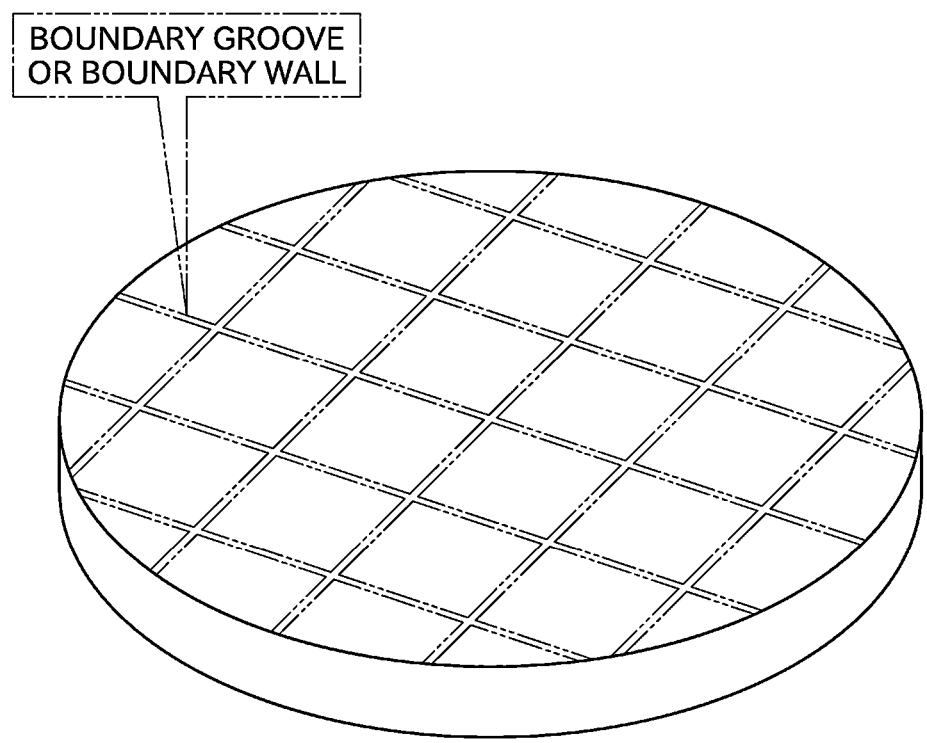
FIG. 4 A diagram schematically showing a semiconductor wafer from which a plurality of chips of semiconductor devices are formed.

Next, a method for manufacturing a semiconductor wafer by using a polycrystalline SiC substrate will be described. FIG. 4 is a diagram schematically showing a semiconductor wafer of division type. The semiconductor wafer is a wafer from which a plurality of chips of semiconductor devices are to be formed. The semiconductor wafer has groove portions or wall portions for sectioning the wafer into the size of each one chip of a semiconductor device. Cutting the semiconductor wafer at the groove portion or the wall portion can divide the semiconductor wafer into the size of each one chip.

Figure 5:
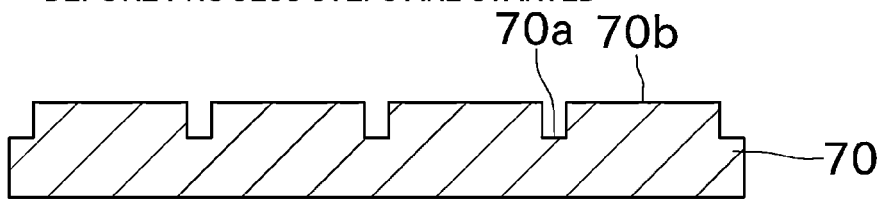
FIG. 5 A diagram showing the former half process of a method for manufacturing a semiconductor wafer including forming a 4H—SiC single crystal layer by using a polycrystalline SiC substrate in which groove portions are formed at boundaries of semiconductor devices.
Figure 5:
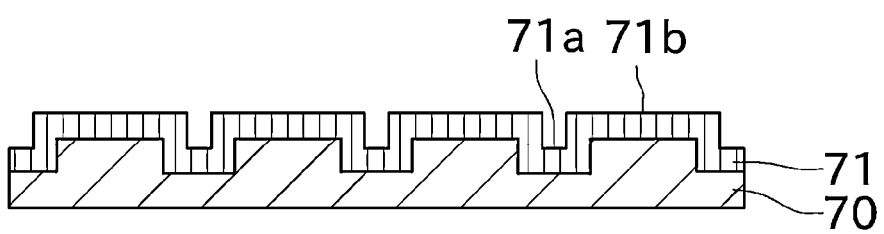
Figure 5:
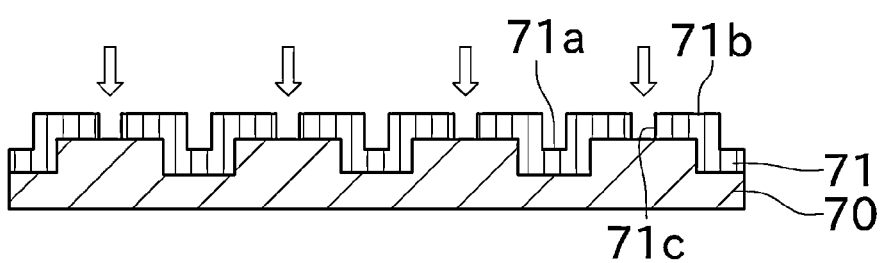
Figure 5:
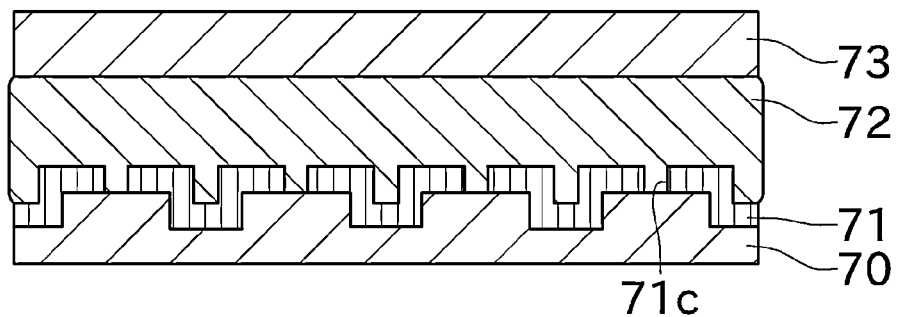
Figure 6:
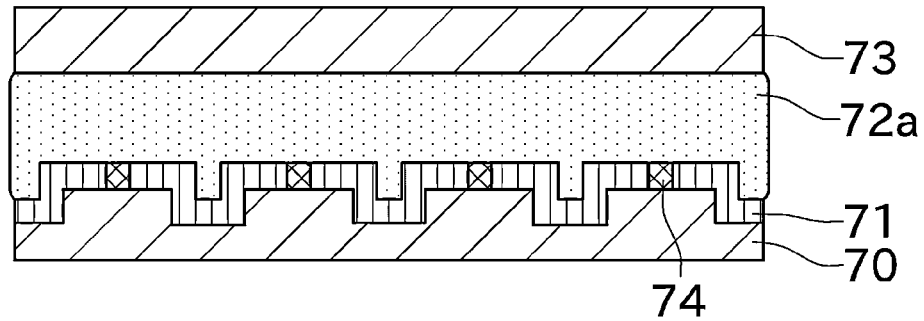
FIG. 6 A diagram showing the latter half process of the method for manufacturing a semiconductor wafer including forming a 4H—SiC single crystal layer by using a polycrystalline SiC substrate in which groove portions are formed at boundaries of semiconductor devices.
Figure 6:
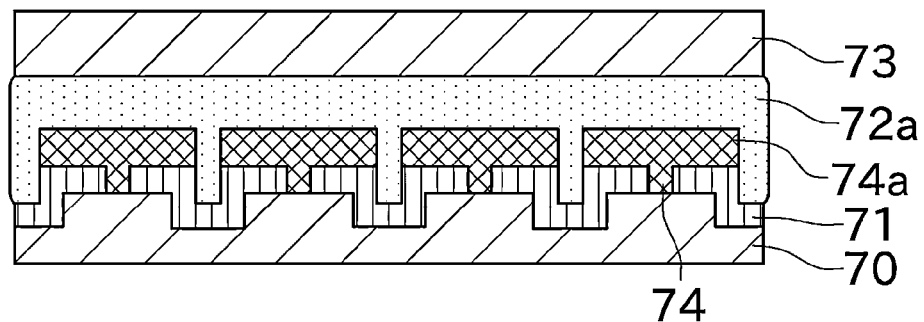
Figure 6:
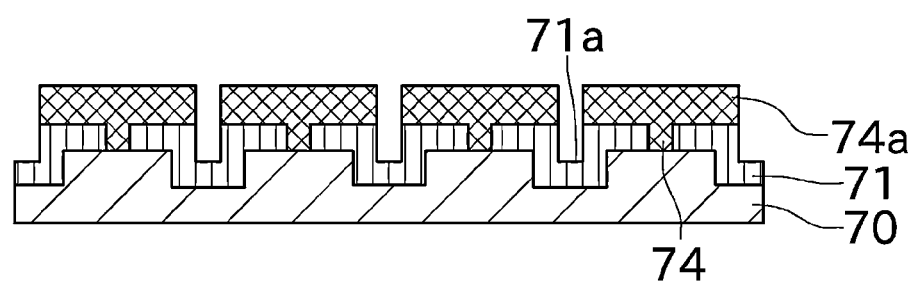

In the following, a first embodiment will be described. In the first embodiment, a semiconductor wafer of division type in which groove portions are formed at boundaries of semiconductor devices is manufactured by using a polycrystalline SiC substrate 70 having groove portions. FIGS. 5 and 6 are process diagrams showing a method for manufacturing a semiconductor wafer including forming a 4H—SiC single crystal layer by using a polycrystalline SiC substrate 70 in which groove portions are formed at boundaries of semiconductor devices.

Firstly, a polycrystalline SiC substrate 70 is prepared. As shown in FIG. 5(a), the polycrystalline SiC substrate 70 has a plurality of groove portions 70a and protrusions 70b defined by the groove portions 70a. The groove portions 70a are formed by appropriate means such as thermal etching or polishing. One protrusion 70b has a size corresponding to the size of one chip of a semiconductor device.

Figure 7:
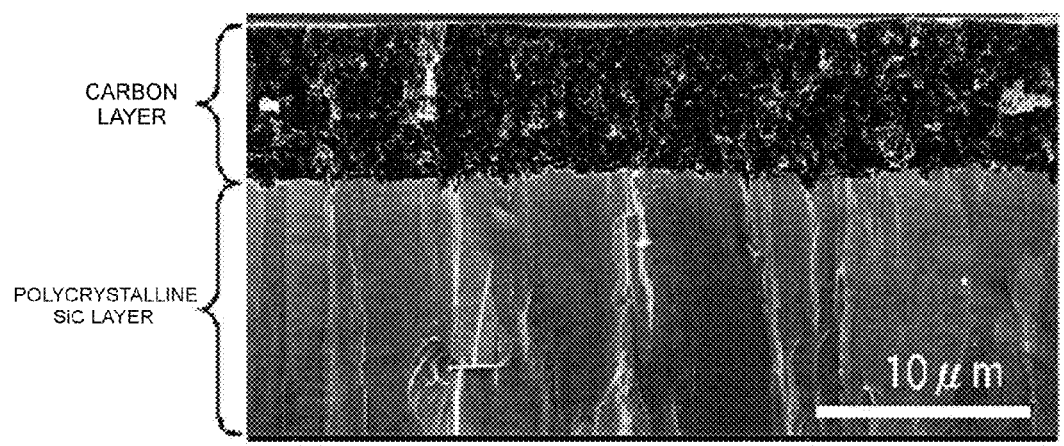
FIG. 7 A photomicrograph of a cross-section showing an example of a polycrystalline SiC substrate and an example of a carbon layer formed on a surface of the substrate.

Then, a carbon layer formation step is performed for forming a carbon layer 71 on a surface of the substrate 70. The carbon layer formation step is performed by using the high-temperature vacuum furnace 11 and the crucible 2. Firstly, the substrate 70 is received in the crucible 2. Then, the inside of the crucible 2 is kept at a high temperature and in a vacuum state by means of the high-temperature vacuum furnace 11, to cause Si in the surface of the substrate 70 to sublimate, so that remaining C forms the carbon layer 71 on the surface of the substrate 70 (see FIG. 5(b)). FIG. 7 shows an example of a photomicrograph showing a cross-section of the substrate 70 and the carbon layer 71 formed in the carbon layer formation step.

It is preferable that a heat treatment performed in the carbon layer formation step includes a preheating step and a main heating step. In the preheating step, the crucible 2 having the substrate 70 received therein is heated in the preheating chamber at a temperature of 800° C. or more. In the main heating step, the crucible 2 is moved from the preheating chamber into the main heating chamber that has been preliminarily heated at a temperature of 1500° C. or more and 2300° C. or less, so that the substrate 70 is heated at a temperature of 1500° C. or more and 2300° C. or less. Such movement from the preheating chamber into the main heating chamber allows a heat treatment to be performed under a rapid temperature rise. Thereby, the carbon layer formation step can be efficiently performed in a short time. This heat treatment is preferably performed under a state where the pressure in the furnace is a vacuum pressure of $10^{-5}$ Torr or less.

Since the plurality of groove portions 70a are formed in the substrate 70 as described above, groove portions 71a are formed in the carbon layer 71 at positions corresponding to the groove portions 70a. As a result, the carbon layer 71 has a plurality of groove portions 71a and protrusions 71b.

Then, a through hole formation step is performed for forming a through hole in the carbon layer 71. The formation of the through hole is implemented by using a laser apparatus. In this embodiment, an infrared laser apparatus is used as the laser apparatus. The laser apparatus used in the through hole formation step is not limited to the infrared laser apparatus. Another laser apparatus is also adoptable as long as the laser apparatus is able to adjust an output of a laser beam so as to remove only the carbon layer 71 without causing any damage to the substrate 70. Preferably, the laser apparatus is able to adjust the spot diameter (the diameter of a laser beam that is emitted to an object) to 50 μm or less. In this step, a laser beam is emitted to a central portion of each of the plurality of protrusions 71b.

Figure 8:
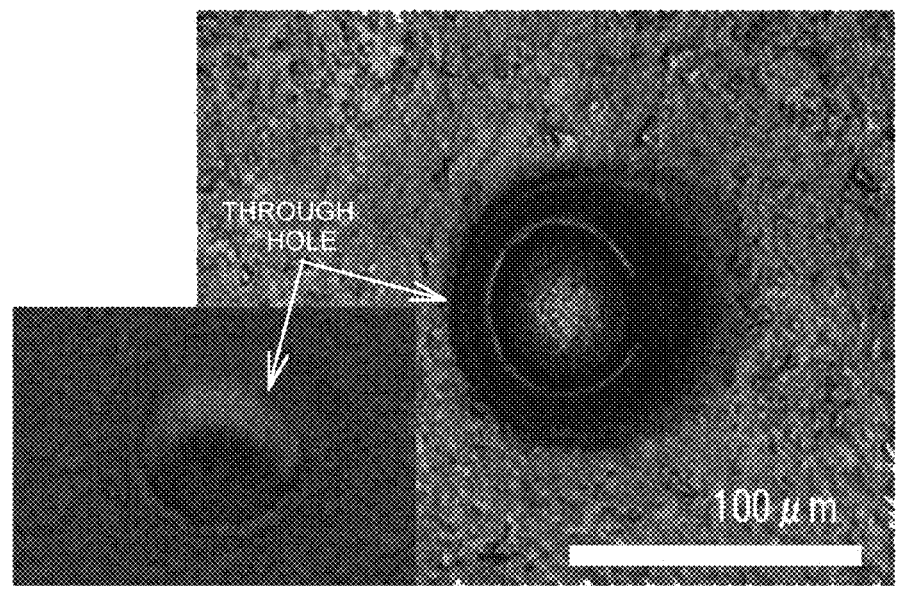
FIG. 8 A photomicrograph showing an example of a through hole that is formed in the carbon layer through laser irradiation.

This can remove part of the carbon layer 71, to form through holes 71c (see FIG. 5(c)). The surface of the substrate 70 can be exposed through the through holes 71c. FIG. 8 is a photomicrograph showing a state where the through hole 71c is formed in the carbon layer 71.

Then, a feeder layer formation step is performed for forming a feeder layer on the surface of the substrate 70. In this step, firstly, Si is vapor-deposited on a surface of the carbon layer 71 through a CVD process, so that a Si layer 72 is formed. Then, a 3C—SiC polycrystalline layer 73 is vapor-deposited so as to cover the Si layer 72 through a CVD process (see FIG. 5(d)).

Then, an epitaxial layer formation step is performed for forming a 4H—SiC single crystal layer. In this step, a heat treatment is performed under a rarefied gas atmosphere that is produced by introduction of an inert gas into vacuum. It is preferable that the heat treatment is performed in a temperature range of 1600° C. or more and 2300° C. or less. Adjusting the heat treatment temperature can control the aspect ratio of an epitaxial layer (4H—SiC single crystal layer) (details thereof will be described later).

Figure 9:
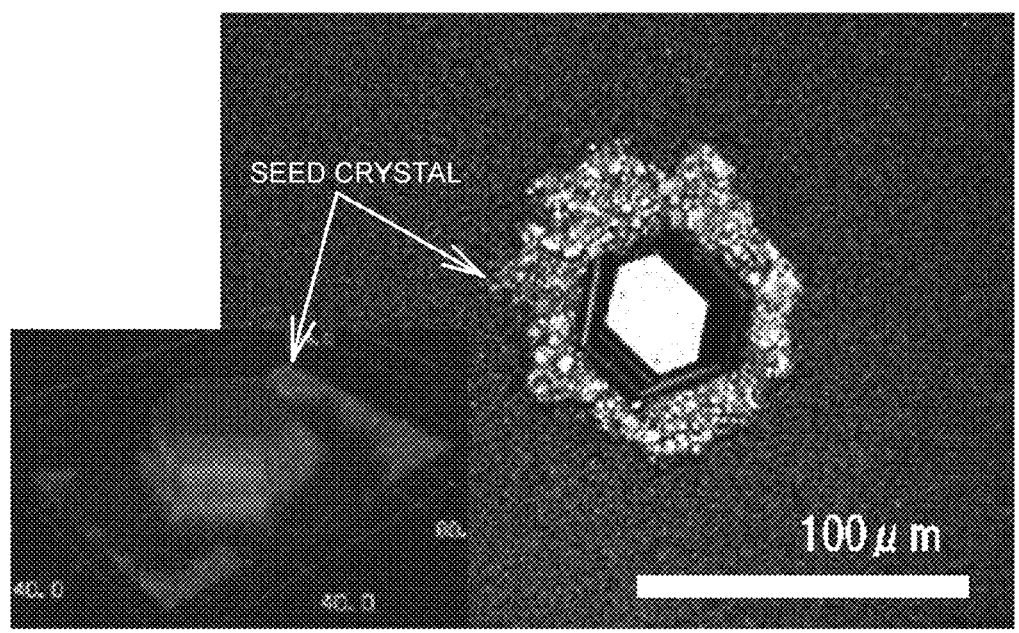
FIG. 9 A photomicrograph showing an example of an epitaxial layer during its growth from a through hole formed in a carbon layer.

Performing the heat treatment causes the Si layer 72 to be melted inside the 3C—SiC polycrystalline layer 73. As a result, as shown in FIG. 6 (e), a Si melt layer 72a is formed inside the 3C—SiC polycrystalline layer 73. The Si melt layer 72a acts like a carbon transfer medium. Therefore, continuing the heat treatment causes a seed crystal 74 made of 4H—SiC single crystal to be generated on portions of the surface of the substrate 70 that are exposed through the through holes 71c (see FIG. 6 (e)). FIG. 9 is a photomicrograph of the seed crystal 74.

Then, the heat treatment is further continued, to cause a close-spaced liquid-phase epitaxial growth of the 4H—SiC seed crystal 74 through a metastable solvent epitaxy process (MSE process). Thus, a 4H—SiC single crystal layer 74a is formed (see FIG. 6 (f)).

The MSE process mentioned herein means a process in which a heat treatment in a high-temperature vacuum environment is performed under a state where a seed layer and a feed layer having a higher free energy than that of the seed layer are arranged opposed to each other and a Si melt layer with a small thickness serving as a solvent is interposed between these layers. This process enables a close-spaced liquid-phase epitaxial growth of 4H—SiC single crystal to be caused in the seed layer side by using, as a drive force, a concentration gradient generated in the Si melt layer because of a difference in the free energy (a concentration gradient that is not based on a temperature gradient).

In this embodiment, the 4H—SiC single crystal layer 74a (seed crystal 74) that has been once formed functions as a seed layer, and the 3C—SiC polycrystalline layer 73 having a higher free energy than that of the seed layer functions as a feed layer. More specifically, a concentration gradient is generated in the Si melt layer because of a difference in the free energy between the 4H—SiC single crystal layer 74a and the 3C—SiC polycrystalline layer 73, and this concentration gradient acts as a drive force to elute Si and C from the 3C—SiC polycrystalline layer 73 into the Si melt layer 72a. C is taken into the Si melt layer 72a, and then moved toward the 4H—SiC single crystal layer 74a, where the C is bound with Si to cause a close-spaced liquid-phase epitaxial growth of the 4H—SiC single crystal layer 74a.

In this embodiment, the groove portion 71a is formed between the protrusions 71b. This can prevent occurrence of interference between adjacent 4H—SiC single crystal layers 74a in the epitaxial layer formation step. Accordingly, the semiconductor device can be efficiently manufactured with effective use of a region of the substrate 70.

Then, the Si melt layer 72a and the 3C—SiC polycrystalline layer 73 are removed, so that a semiconductor wafer having the 4H—SiC single crystal layers 74a formed thereon is obtained (see FIG. 6 (g)).

Figure 10:
FIG. 10 A diagram showing the former half process of a method for manufacturing a semiconductor wafer including forming a 4H—SiC single crystal layer by using a polycrystalline SiC substrate in which wall portions are formed at boundaries of semiconductor devices.
Figure 10:
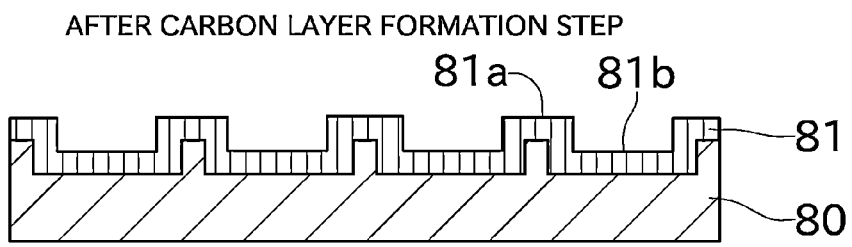
Figure 10:
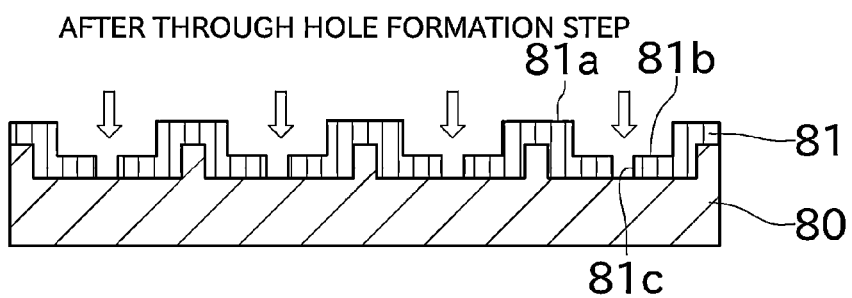
Figure 10:
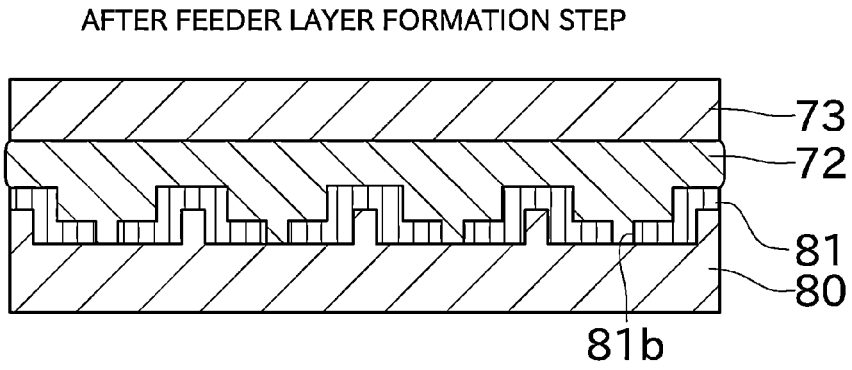
Figure 11:
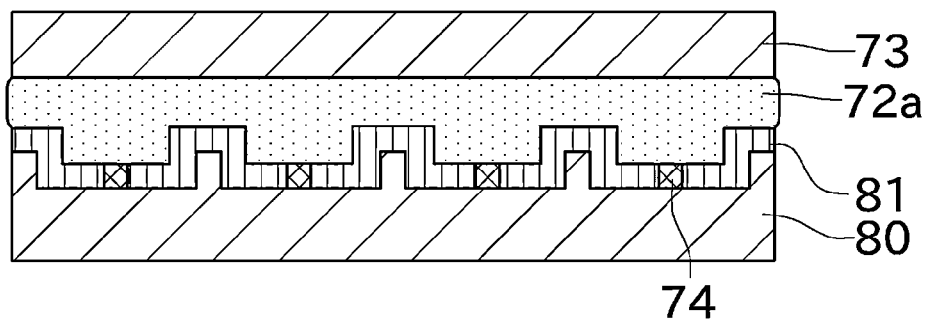
FIG. 11 A diagram showing the latter half process of the method for manufacturing a semiconductor wafer including forming a 4H—SiC single crystal layer by using a polycrystalline SiC substrate in which wall portions are formed at boundaries of semiconductor devices.
Figure 11:
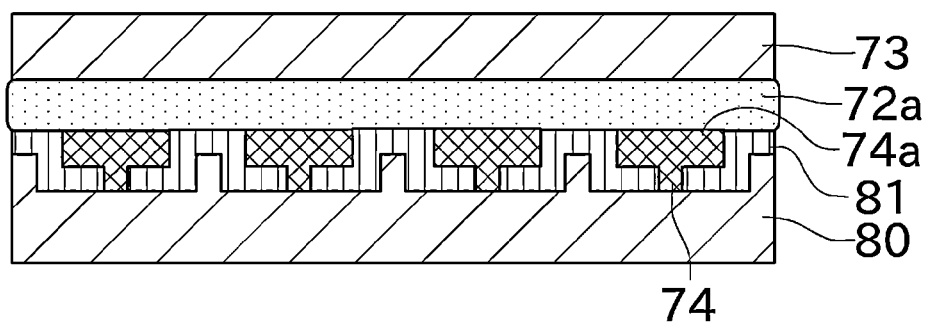
Figure 11:
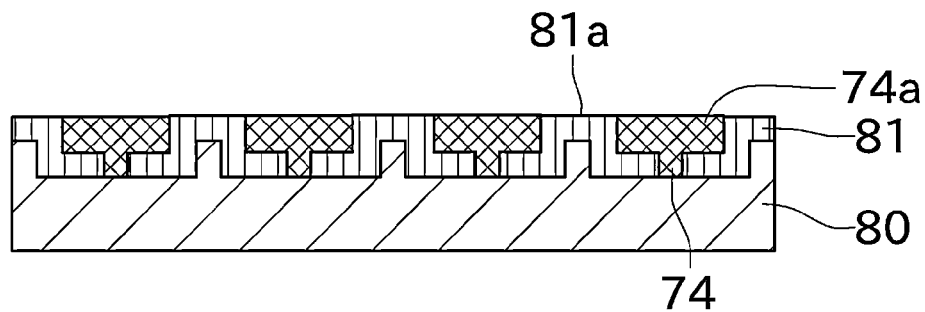

Next, a second embodiment will be described. In the second embodiment, a semiconductor wafer of division type is manufactured by using a polycrystalline SiC substrate 70 having wall portions instead of groove portions. FIGS. 10 and 11 are process diagrams showing a method for manufacturing a semiconductor wafer including forming a 4H—SiC single crystal layer by using a polycrystalline SiC substrate in which wall portions are formed at boundaries of semiconductor devices. In the following, a description may be simplified or omitted of the same step as the step of forming the groove portions at the boundaries (first embodiment).

Firstly, a polycrystalline SiC substrate 80 is prepared. As shown in FIG. 10(a), the polycrystalline SiC substrate 80 has a plurality of wall portions 80a and recesses 80b defined by the wall portions 80a. The recesses 80b are formed by appropriate means such as thermal etching or polishing. One recess 80b has a size corresponding to the size of one chip of a semiconductor device.

Then, a carbon layer formation step is performed for forming a carbon layer 81 on the substrate 80. In the carbon layer formation step, similarly to the first embodiment, the substrate 80 is received in the crucible 2, and the inside of the crucible 2 is kept at a high temperature and in a vacuum state by means of the high-temperature vacuum furnace 11. This heat treatment causes Si in the surface of the substrate 80 to sublimate, so that remaining C forms the carbon layer 81 on the surface of the substrate 80 (see FIG. 10(b)).

Since the plurality of wall portions 80a are formed in the substrate 80 as described above, wall portions 81a are formed in the carbon layer 81 at positions corresponding to the wall portions 80a. As a result, the carbon layer 81 has a plurality of wall portions 81a and recesses 81b.

Then, a through hole formation step is performed for forming a through hole in the carbon layer 81 thus formed. The formation of the through hole is implemented by using a laser apparatus. In this step, a laser beam is emitted to a central portion of each of the plurality of recesses 81b.

This can remove part of the carbon layer 81, to form through holes 81c (see FIG. 10(c)). The surface of the substrate 80 can be exposed through the through holes 81c.

Then, a feeder layer formation step is performed for forming a feeder layer on the surface of the substrate 80. In this step, firstly, Si is vapor-deposited on a surface of the carbon layer 81 through a CVD process, so that a Si layer 72 is formed. Then, a 3C—SiC polycrystalline layer 73 is vapor-deposited so as to cover the Si layer 72 through a CVD process (see FIG. 10(d)).

Then, an epitaxial layer formation step is performed for forming a 4H—SiC single crystal layer. In this step, a heat treatment is performed in a temperature range of 1600° C. or more and 2300° C. or less by using the high-temperature vacuum furnace 11. Performing the heat treatment causes the Si layer 72 to be melted inside the 3C—SiC polycrystalline layer 73. As a result, as shown in FIG. 11(e), a Si melt layer 72a is formed inside the 3C—SiC polycrystalline layer 73. Thus, a seed crystal 74 made of 4H—SiC single crystal is generated on portions of the surface of the substrate 80 that are exposed through the through holes 81c (see FIG. 11(e)). Then, the heat treatment is continued, to cause an epitaxial growth of the seed crystal 74, thus forming a 4H—SiC single crystal layer 74a (see FIG. 11(f)).

In this embodiment, the wall portion 81a is formed between the recesses 81b. This can prevent occurrence of interference between adjacent 4H—SiC single crystal layers 74a in the epitaxial layer formation step. Accordingly, the semiconductor device can be efficiently manufactured with effective use of a region of the substrate 80.

Then, the Si melt layer 72a and the 3C—SiC polycrystalline layer 73 are removed, so that a semiconductor wafer having the 4H—SiC single crystal layers 74a formed thereon is obtained (see FIG. 11(g)).

Next, a description will be given to a configuration for controlling the aspect ratio of the formed 4H—SiC single crystal layer 74a by adjusting the temperature (growth temperature) in the heat treatment in the epitaxial layer formation step.

Figure 12:
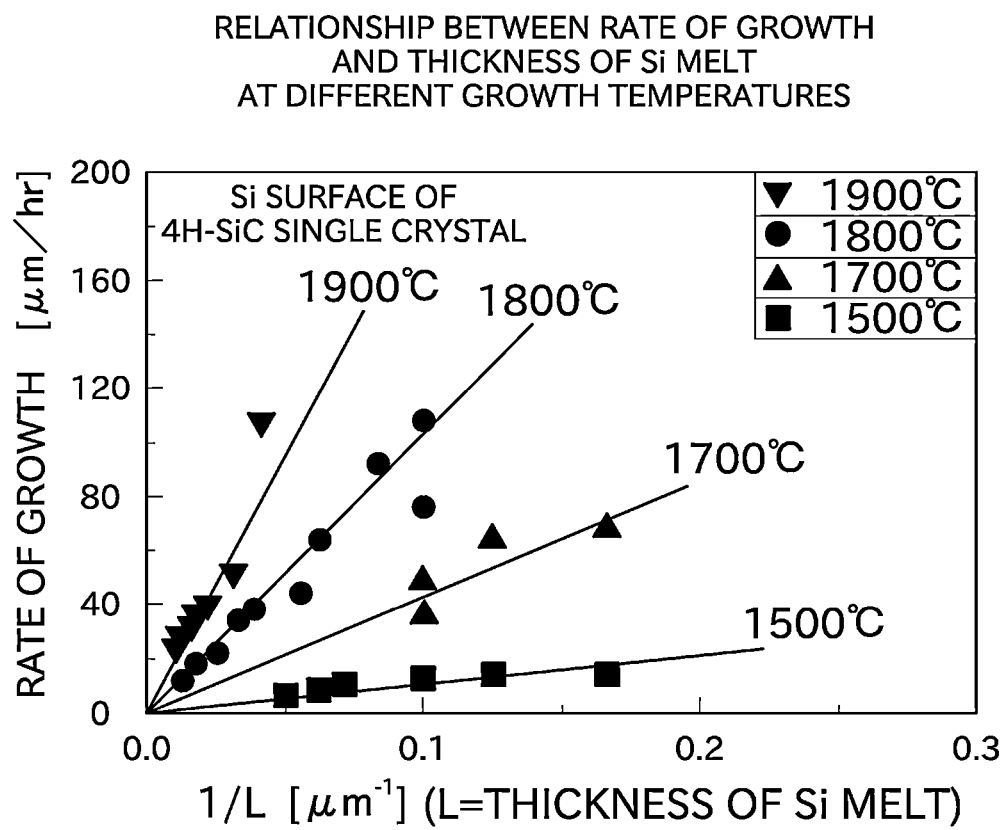
FIG. 12 A graph showing the relationship between the rate of growth and the thickness of a Si melt at a plurality of growth temperatures.

Firstly, the relationship between the rate of growth and the thickness of a Si melt will be described with reference to FIG. 12. FIG. 12 is a graph showing the relationship between the rate of growth and the thickness of a Si melt at a plurality of growth temperatures.

In the graph of FIG. 12, the vertical axis represents the rate of growth of the 4H—SiC single crystal layer, and the horizontal axis represents the inverse of the thickness of the Si melt layer. The graph of FIG. 12 shows the relationship between the thickness of the Si melt layer and the rate of growth of the 4H—SiC single crystal layer in each of the cases where the growth temperature is 1500° C., 1700° C., 1800° C., and 1900° C.

The graph reveals that the rate of growth of the 4H—SiC single crystal layer decreases as the thickness of the Si melt layer increases at each growth temperature. This would be because an increase in the thickness of the Si melt layer results in an increase in the distance between the 3C—SiC polycrystalline layer and the 4H—SiC single crystal layer and therefore it takes more time for C atoms to move.

Figure 13:
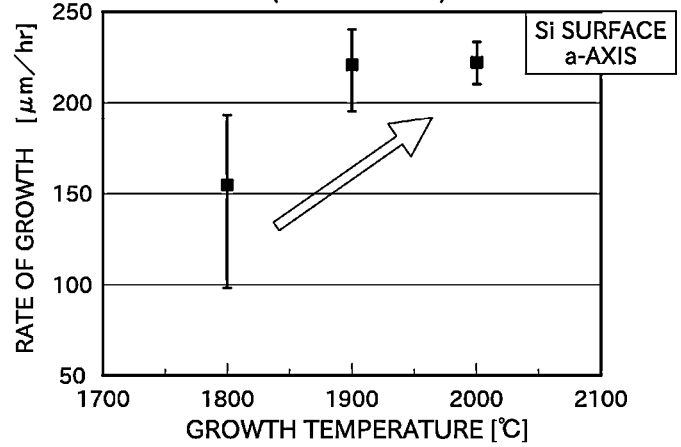
FIG. 13 Graphs showing changes in the rate of growth on a Si surface of 4H—SiC single crystal with respect to an a-axis direction and a c-axis direction, and a graph showing a change in the aspect ratio of the rate of growth in the a-axis direction to the rate of growth in the c-axis direction.
Figure 13:
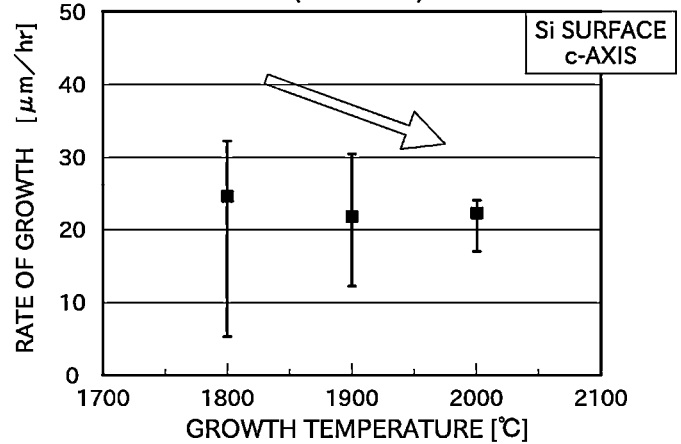
Figure 13:
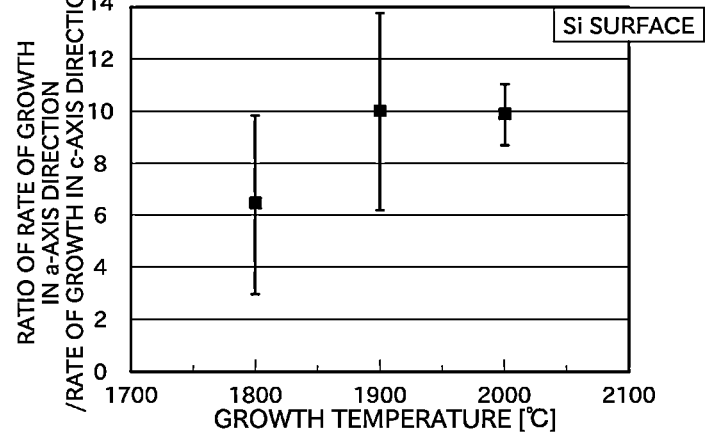
Figure 14:
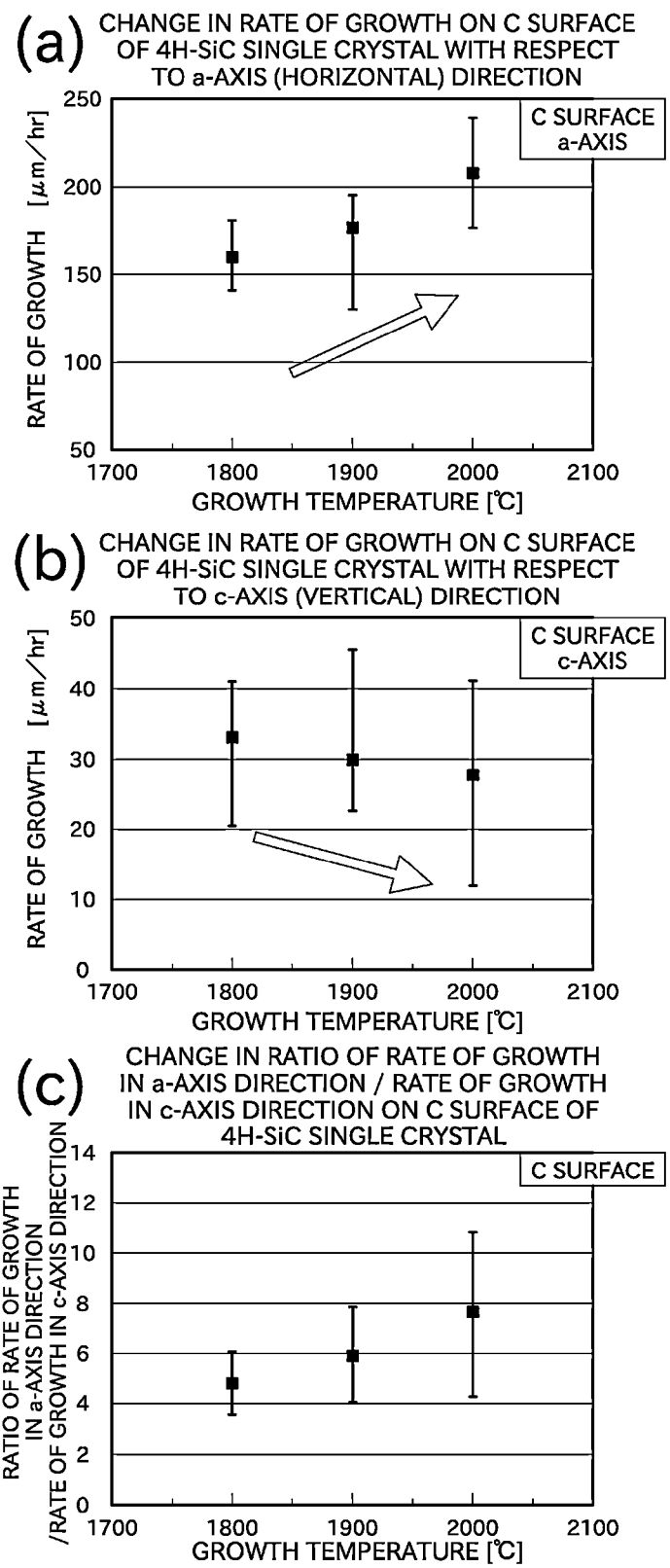
FIG. 14 Graphs showing changes in the rate of growth on a C surface of 4H—SiC single crystal with respect to the a-axis direction and the c-axis direction, and a graph showing a change in the aspect ratio of the rate of growth in the a-axis direction to the rate of growth in the c-axis direction.

Next, the relationship between the rate of growth of the 4H—SiC single crystal and the growth temperature will be described with reference to FIGS. 13 and 14. FIG. 13 contains graphs showing changes in the rate of growth on a Si surface of 4H—SiC single crystal with respect to an a-axis direction and a c-axis direction, and a graph showing a change in the aspect ratio of the rate of growth in the a-axis direction to the rate of growth in the c-axis direction. FIG. 14 contains graphs showing changes in the rate of growth on a C surface of 4H—SiC single crystal with respect to the a-axis direction and the c-axis direction, and a graph showing a change in the aspect ratio of the rate of growth in the a-axis direction to the rate of growth in the c-axis direction.

In the graphs of FIGS. 13(a), 13(b), 14(a), and 14(b), the vertical axis represents the rate of growth of the 4H—SiC single crystal, and the horizontal axis represents the growth temperature. The graphs of FIGS. 13 and 14 show the relationship between the rate of growth and the growth temperature with respect to different surfaces (Si surface or C surface) of the 4H—SiC single crystal and different directions (a-axis direction or c-axis direction).

FIG. 13 shows the relationship between the rate of growth on the Si surface of 4H—SiC single crystal and the growth temperature. FIG. 13(a) shows the relationship between the rate of growth in the a-axis direction and the growth temperature. FIG. 13(b) shows the relationship between the rate of growth in the c-axis direction and the growth temperature. The graph of FIG. 13(a) reveals that a higher growth temperature tends to result in an increase in the rate of growth in the a-axis direction. The graph of FIG. 13(b) reveals that a higher growth temperature tends to result in a decrease in the rate of growth in the c-axis direction. FIG. 13(c) is a graph showing a change in the aspect ratio of the rate of growth in the a-axis direction to the rate of growth in the c-axis direction. The graph reveals that a higher growth temperature results in an increase in the aspect ratio.

These tendencies apply to the C surface of the 4H—SiC single crystal, too, as shown in FIG. 14. That is, in the C surface as well, a higher growth temperature tends to result in an increase in the rate of growth in the a-axis direction as shown in FIG. 14(a), while a higher growth temperature tends to result in a decrease in the rate of growth in the c-axis direction as shown in FIG. 14(b). FIG. 14(c) is a graph showing a change in the aspect ratio of the rate of growth in the a-axis direction to the rate of growth in the c-axis direction. As shown in FIG. 14(c), a higher growth temperature results in an increase in the aspect ratio.

That is, 4H—SiC single crystal has such properties that the ratio of growth rates (the rate of growth in the a-axis direction/the rate of growth in the c-axis direction) changes in accordance with a change in the growth temperature. Accordingly, the ratio of growth rates can be controlled by setting of the growth temperature.

Setting a temperature for the heat treatment during the epitaxial layer formation step based on the above enables formation of the 4H—SiC single crystal layer 74a having a desired aspect ratio. When not only the growth temperature but also the thickness of the Si melt layer 72a shown in FIG. 12 is considered, a specific rate of growth in each of the horizontal direction (a-axis direction) and the vertical direction (c-axis direction) can be guessed. Therefore, the 4H—SiC single crystal layer 74a having a desired shape can be formed.

As thus far described above, the method for manufacturing a semiconductor wafer according to these embodiments includes the carbon layer formation step, the through hole formation step, the feed layer formation step, and the epitaxial layer formation step. In the carbon layer formation step, the carbon layer 71, 81 is formed on the surface of the substrate 70, 80 that is, at least in its surface, made of polycrystalline SiC. In the through hole formation step, a laser beam is emitted to the carbon layer 71, 81 formed on the substrate 70, 80, to form the through holes 71c, 81c in the carbon layer 71, 81. In the feed layer formation step, the Si layer 72 is formed on the surface of the carbon layer 71, 81 that has been formed on the substrate 70, 80, and the 3C—SiC polycrystalline layer 73 is formed on the surface of the Si layer 72. In the epitaxial layer formation step, a heat treatment in a temperature range of 1600° C. or more and 2300° C. or less is performed on the substrate 70, 80, so that the seed crystal 74 made of 4H—SiC single crystal is formed on portions of the surface of the substrate 70, 80 that are exposed through the through holes 71c, 81c, and the heat treatment is continued to cause a close-spaced liquid-phase epitaxial growth of the seed crystal 74, so that the 4H—SiC single crystal layer 74a is formed.

Thus, a semiconductor wafer can be manufactured by using a substrate that is, at least in its surface, made of polycrystalline SiC. Accordingly, the manufacturing cost of the semiconductor wafer can be reduced, and a semiconductor wafer having a large diameter can be manufactured.

In the method for manufacturing a semiconductor wafer according to these embodiments, the plurality of groove portions 70a or wall portions 80a are formed on the surface of the substrate 70, 80. In the through hole formation step, the through hole is formed in each of regions enclosed by the groove portions 70a or the wall portions 80a. In the epitaxial layer formation step, the 4H—SiC single crystal layer 74a is formed in each of the regions.

The groove portions 70a or the wall portions 80a allows prevention of interference. For example, hindrance to the growth due to contact between adjacent 4H—SiC single crystal layers 74a, or generation of crystal dislocation in a portion where the contact occurs, can be prevented. Accordingly, a semiconductor wafer having the 4H—SiC single crystal layers 74a corresponding to a plurality of chips can be manufactured with a high quality and in a shorter growth time than the growth time required for a single seed crystal to grow to the entire area of the wafer.

In the method for manufacturing a semiconductor wafer according to these embodiments, in the carbon layer formation step, heating is performed in a temperature range of 1500° C. or more and 2300° C. or less under a vacuum of $10^{-5}$ Torr or less, to cause Si atoms in the surface of the substrate to sublimate, so that the carbon layer 71, 81 is formed.

Thereby, a thin film made of a carbon nano-material can be successfully generated on the surface of the substrate 70, 80. This enables only the portions exposed through the through holes 71c, 81c to react in the epitaxial layer formation step. Additionally, this can prevent entry of impurities into a gap between the substrate 70, 80 and the carbon layer 71, 81 in the carbon layer formation step.

In the method for manufacturing a semiconductor wafer according to these embodiments, the laser beam used in the through hole formation step is an infrared laser beam having a spot diameter of 50 μm or less.

As a result, the area of the portions of the substrate 70, 80 that are exposed through the through holes 71c, 81c can be reduced, and a single seed crystal can be generated in each of the through holes. Generation of a plurality of seed crystals in each through hole, occurrence of hindrance to the growth due to contact between the seed crystals, and generation of crystal dislocation in a portion where the contact occurs, can be suppressed. Thus, the seed crystal 74 can be generated in an appropriate manner.

In the method for manufacturing a semiconductor wafer according to these embodiments, a temperature for the heat treatment during the epitaxial layer formation step is set based on the relationship between the temperature and the rate of epitaxial growth of 4H—SiC single crystal in the a-axis direction and the relationship between the temperature and the rate of epitaxial growth of 4H—SiC single crystal in the c-axis direction, to adjust the aspect ratio of the 4H—SiC single crystal layer 74a such that the size of the epitaxial layer in the horizontal direction (a-axis direction) is about five to ten times the size of the epitaxial layer in the thickness direction (c-axis direction).

Accordingly, semiconductor wafers can be manufactured in which the aspect ratio of the 4H—SiC single crystal layer 74a has been adjusted in accordance with various demands. Since no special member is required for adjusting the aspect ratio, a manufacturing apparatus can be simplified.

Although some embodiments of the present invention have been described above, the above-described configuration can be further modified as follows.

The shape of the polycrystalline SiC substrate shown in FIGS. 5, 10, and the like, is an illustrative one. The shape can be appropriately changed in accordance with a required size of one chip.

In the above-described embodiments, heating is performed at a high temperature and in a vacuum state by means of the high-temperature vacuum furnace 11, to form the carbon layer 71 on the surface of the substrate 70 (or the substrate 80). However, this is not the only method for forming a carbon layer. The carbon layer can be formed by using a known technique such as a CVD process, an organic resist process, or electron cyclotron resonance sputtering.

The above-described embodiments adopt a CVD process for the vapor-deposition of Si and 3C—SiC polycrystal on the surface of the carbon layer in the feeder layer formation step. Instead, it may be also acceptable that a Si substrate and a polycrystalline SiC substrate are laminated.

In application of the present invention, needless to say, the above-described manufacturing method can be partially changed. The temperature condition, the pressure condition, and the like, adopted in the above-described embodiments are merely illustrative, and they are appropriately changeable depending on circumstances including, for example, a configuration of the apparatus and intended use.

DESCRIPTION OF THE REFERENCE NUMERALS 70, 80 polycrystalline SiC substrate
71, 81 carbon layer
71a groove portion
71c, 81c through hole
81a wall portion
72 Si layer
72a Si melt layer
73 3C—SiC polycrystalline layer
74 seed crystal
74a 4H—SiC single crystal layer

The invention claimed is:

1. A method for manufacturing a semiconductor wafer, the method comprising:
a carbon layer formation step of forming a carbon layer on a surface of a substrate that is, at least in its surface, made of polycrystalline SiC;
a through hole formation step of forming a through hole in the carbon layer formed in the substrate;
a feed layer formation step of forming a Si layer on a surface of the carbon layer formed on the substrate and forming a feed layer on a surface of the Si layer, the feed layer being made of polycrystalline SiC; and
an epitaxial layer formation step of performing a heat treatment on the substrate in a temperature range of 1600° C. or more and 2300° C. or less to cause a seed crystal made of 4H—SiC single crystal to be formed on a portion of the surface of the substrate that is exposed through the through hole, and continuing the heat treatment to cause a close-spaced liquid-phase epitaxial growth of the seed crystal, so that an epitaxial layer made of 4H—SiC single crystal is formed.

2. The method for manufacturing a semiconductor wafer according to claim 1, wherein
a plurality of groove portions or wall portions are formed on the surface of the substrate,
in the through hole formation step, the through hole is formed in each of regions enclosed by the groove portions or the wall portions,
in the epitaxial layer formation step, the epitaxial layer made of 4H—SiC single crystal is formed in each of the regions.

3. The method for manufacturing a semiconductor wafer according to claim 1, wherein
in the carbon layer formation step, heating is performed in a temperature range of 1500° C. or more and 2300° C. or less under vacuum, to cause Si atoms in the surface of the substrate to sublimate, so that the carbon layer is formed.

4. The method for manufacturing a semiconductor wafer according to claim 1, wherein
in the carbon layer formation step, the carbon layer is formed through a chemical vapor deposition process, an organic resist process, or electron cyclotron resonance sputtering.

5. The method for manufacturing a semiconductor wafer according to claim 1, wherein
in the through hole formation step, an infrared laser beam is used to form the through hole in the carbon layer, the infrared laser beam having a spot diameter of 100 µm or less.

6. The method for manufacturing a semiconductor wafer according to claim 1, wherein
in the epitaxial layer formation step, the temperature for the heat treatment is controlled to cause the epitaxial layer made of 4H—SiC single crystal to grow in such a manner that the rate of epitaxial growth in a horizontal direction of the epitaxial layer is five to ten times higher than the rate of epitaxial growth in a thickness direction of the epitaxial layer.

7. A semiconductor wafer manufactured by the method for manufacturing a semiconductor wafer according to claim 1, wherein
the temperature for the heat treatment for causing a close-spaced liquid-phase epitaxial growth of the seed crystal is controlled to control the aspect ratio of the epitaxial layer made of 4H—SiC single crystal in such a manner that the size in a horizontal direction of the epitaxial layer is five to ten times the size in a thickness direction of the epitaxial layer.

* * * * *